US012721210B2

(12) United States Patent
Chung et al.

(10) Patent No.: US 12,721,210 B2
(45) Date of Patent: Aug. 25, 2026

(54) SEMICONDUCTOR STRUCTURE AND FABRICATION METHOD THEREOF

(71) Applicant: UNITED MICROELECTRONICS CORP., Hsin-Chu City (TW)

(72) Inventors: Yao-Hsien Chung, Tainan City (TW); Fu-Yu Tsai, Tainan City (TW); Bin-Siang Tsai, Changhua County (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 382 days.

(21) Appl. No.: 18/419,583

(22) Filed: Jan. 23, 2024

(65) Prior Publication Data

US 2025/0210553 A1 Jun. 26, 2025

(30) Foreign Application Priority Data

Dec. 20, 2023 (TW) ................................ 112149771

(51) Int. Cl.
*H10W 72/90* (2026.01)
*H10W 70/63* (2026.01)
*H10W 72/00* (2026.01)

(52) U.S. Cl.
CPC ......... *H10W 72/90* (2026.01); *H10W 72/019* (2026.01); *H10W 70/635* (2026.01); *H10W 72/923* (2026.01); *H10W 72/926* (2026.01); *H10W 72/952* (2026.01); *H10W 72/957* (2026.01)

(58) Field of Classification Search
CPC . H10W 72/90; H10W 72/019; H10W 70/635; H10W 72/923; H10W 72/926; H10W 72/952; H10W 72/957; H10W 70/60; H10W 70/611; H10W 99/00; H10W 72/30; H10W 72/013
See application file for complete search history.

(56) References Cited

U.S. PATENT DOCUMENTS 10,658,315 B2* 5/2020 Bih ...................... H10P 70/234
2002/0163072 A1 11/2002 Gupta
2012/0068344 A1* 3/2012 Bonilla ................ H10W 20/48 438/618
2019/0371780 A1* 12/2019 Yaung .................. H10W 90/00
2025/0132210 A1* 4/2025 Chung .................. H10W 76/48
2025/0192104 A1* 6/2025 Hsu ...................... H10W 90/00

* cited by examiner

*Primary Examiner* — Douglas W Owens
(74) *Attorney, Agent, or Firm* — Winston Hsu

(57) ABSTRACT

A semiconductor structure includes a semiconductor substrate; an interconnection structure disposed on the semiconductor substrate; a cap layer disposed on the interconnection structure; a top dielectric layer disposed on the cap layer; a bonding dielectric layer disposed on the top dielectric layer; a plurality of copper pads disposed in the bonding dielectric layer, the top dielectric layer and the cap layer; and a plurality of dangling-bond pads disposed in the bonding dielectric layer and the top dielectric layer.

20 Claims, 7 Drawing Sheets

SEMICONDUCTOR STRUCTURE AND FABRICATION METHOD THEREOF

BACKGROUND OF THE INVENTION

1. Field of the Invention

The present invention relates to the field of semiconductor technology, and in particular to an improved semiconductor structure, which is suitable for wafer bonding and can improve wafer edge bonding defects.

2. Description of the Prior Art

Wafer bonding is a process for temporary or permanent joining of two or more wafers with or without an intermediate layer. During direct wafer bonding, how to increase the bonding strength is a concern.

There is a need in this technical field to provide an improved semiconductor structure to avoid the formation of edge bonding voids during the wafer bonding process. There remains a need in the art to provide an improved semiconductor structure to form more bonding and increase bonding strength during the wafer bonding process.

SUMMARY OF THE INVENTION

It is one object of the present invention to provide an improved semiconductor structure and manufacturing method to solve the deficiencies or shortcomings of the prior art.

One aspect of the invention provides a semiconductor structure including a semiconductor substrate; an interconnection structure disposed on the semiconductor substrate; a cap layer disposed on the interconnection structure; a top dielectric layer disposed on the cap layer; a bonding dielectric layer disposed on the top dielectric layer; a plurality of copper pads disposed in the bonding dielectric layer, the top dielectric layer and the cap layer; and a plurality of dangling-bond pads disposed in the bonding dielectric layer and the top dielectric layer.

According to some embodiments, the plurality of dangling-bond pads comprises a silicon-rich oxide layer.

According to some embodiments, the plurality of dangling-bond pads comprises a SiOCH layer.

According to some embodiments, the plurality of dangling-bond pads does not penetrate through the cap layer.

According to some embodiments, the plurality of dangling-bond pads has a top surface that is coplanar with a top surface of the plurality of copper pads and a top surface of the bonding dielectric layer.

According to some embodiments, the top dielectric layer comprises silicon oxide.

According to some embodiments, the top dielectric layer has a thickness of 9000-9500 angstroms.

According to some embodiments, the bonding dielectric layer comprises nitrogen-doped silicon carbide.

According to some embodiments, the bonding dielectric layer has a thickness of 1500-2100 angstroms.

According to some embodiments, the semiconductor substrate comprises a silicon-on-insulator (SOI) substrate.

Another aspect of the invention provides a method of forming a semiconductor structure. A semiconductor substrate is provided. An interconnection structure is formed on the semiconductor substrate. A cap layer is formed on the interconnection structure. A top dielectric layer is formed on the cap layer. A bonding dielectric layer is formed on the top dielectric layer. A plurality of copper pads is formed in the bonding dielectric layer, the top dielectric layer and the cap layer. A plurality of dangling-bond pads is formed in the bonding dielectric layer and the top dielectric layer.

According to some embodiments, the plurality of dangling-bond pads comprises a silicon-rich oxide layer.

According to some embodiments, the plurality of dangling-bond pads comprises a SiOCH layer.

According to some embodiments, the plurality of dangling-bond pads does not penetrate through the cap layer.

According to some embodiments, the plurality of dangling-bond pads has a top surface that is coplanar with a top surface of the plurality of copper pads and a top surface of the bonding dielectric layer.

According to some embodiments, the top dielectric layer comprises silicon oxide.

According to some embodiments, the top dielectric layer has a thickness of 9000-9500 angstroms.

According to some embodiments, the bonding dielectric layer comprises nitrogen-doped silicon carbide.

According to some embodiments, the bonding dielectric layer has a thickness of 1500-2100 angstroms.

According to some embodiments, the semiconductor substrate comprises a silicon-on-insulator (SOI) substrate.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized, and structural, logical, and electrical changes may be made without departing from the scope of the present invention. Therefore, the following detailed description is not to be considered as limiting, but the embodiments included herein are defined by the scope of the accompanying claims.

Figure 1:
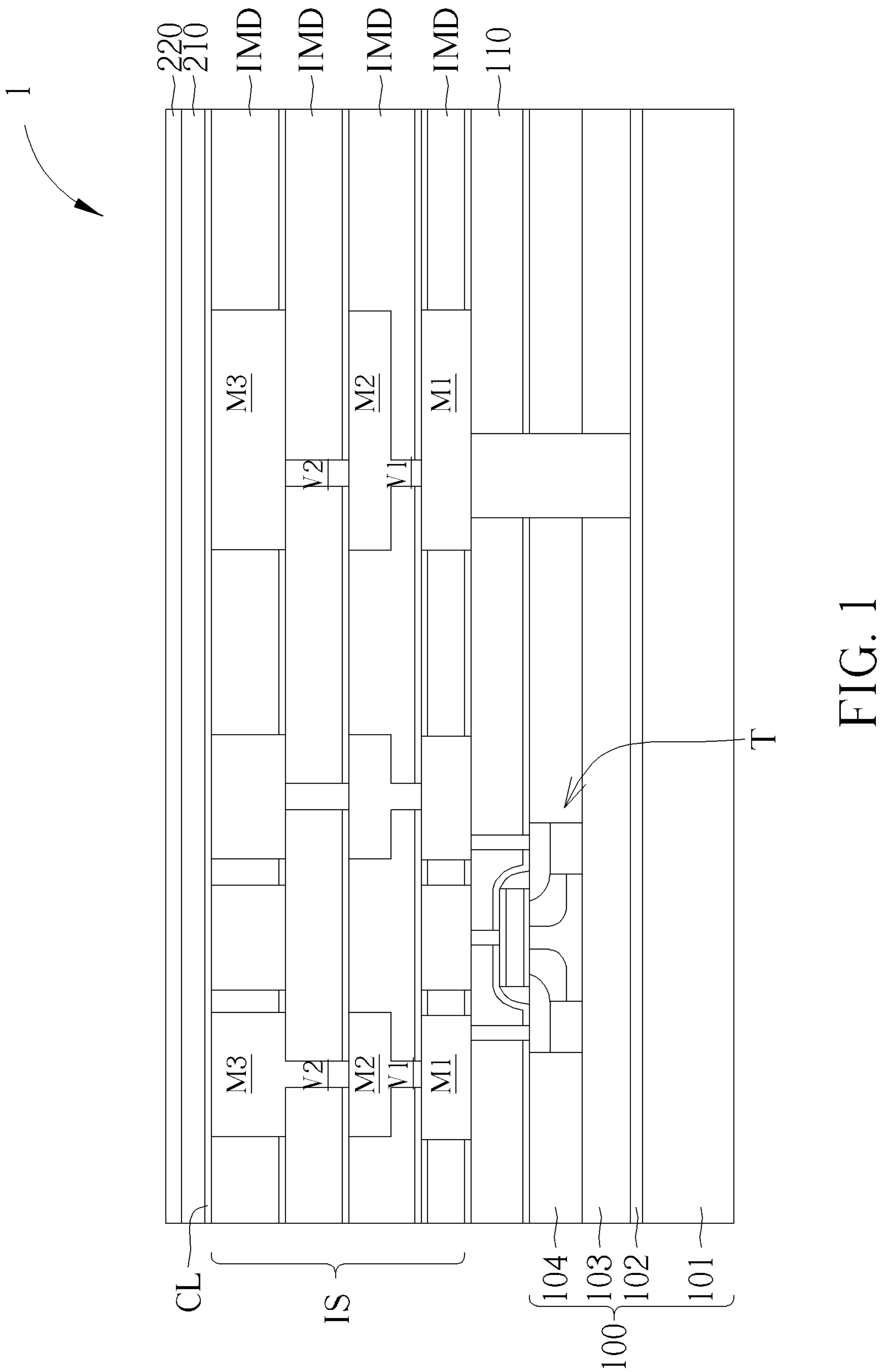
FIG. 1 to FIG. 7 are schematic diagrams of a method of manufacturing a semiconductor structure according to an embodiment of the present invention.

Please refer to FIG. 1 to FIG. 7, which are schematic diagrams of a method of manufacturing a semiconductor structure 1 according to an embodiment of the present invention. As shown in FIG. 1, a semiconductor substrate 100, for example, a silicon-on-insulator (SOI) substrate is provided. According to an embodiment of the present invention, the semiconductor substrate 100 may include a base layer 101, a trap-rich layer 102 that is contiguous with the base layer 101, a buried oxide layer 103 that is contiguous with the trap-rich layer 102, and a device layer 104 that is contiguous with the buried oxide layer 103. According to an embodiment of the present invention, for example, the trap-rich layer 102 may include amorphous silicon or polycrystalline silicon.

According to an embodiment of the present invention, a circuit element T and a dielectric layer 110 covering the circuit element T may be formed on the device layer 104. According to an embodiment of the present invention, for example, the circuit element T may be a MOS transistor. According to an embodiment of the present invention, for example, the dielectric layer 110 may include an undoped silicate glass (USG) layer or a silicon oxide layer, but is not limited thereto.

After planarizing the dielectric layer 110, an interconnection structure IS is formed on the semiconductor substrate 100. According to an embodiment of the present invention, for example, the interconnect structure IS may include metal conductor layers M1-M3, via layers V1 and V2, and an inter-metal dielectric layer IMD. Those skilled in the art should understand that the interconnection structure IS in the figure is only for illustration.

Subsequently, a cap layer CL is formed on the interconnection structure IS. According to an embodiment of the present invention, for example, the cap layer CL may include nitrogen-doped silicon carbide, but is not limited thereto. A top dielectric layer 210 is then formed on the cap layer CL. According to an embodiment of the present invention, for example, the top dielectric layer 210 may include silicon oxide, but is not limited thereto. According to an embodiment of the present invention, the thickness of the top dielectric layer 210 is 9000-9500 angstroms.

Subsequently, a bonding dielectric layer 220 is formed on the top dielectric layer 210 for wafer bonding. According to an embodiment of the present invention, for example, the bonding dielectric layer 220 may include nitrogen-doped silicon carbide, but is not limited thereto. According to an embodiment of the present invention, the thickness of the bonding dielectric layer 220 is 1500-2100 angstroms.

Figure 2:
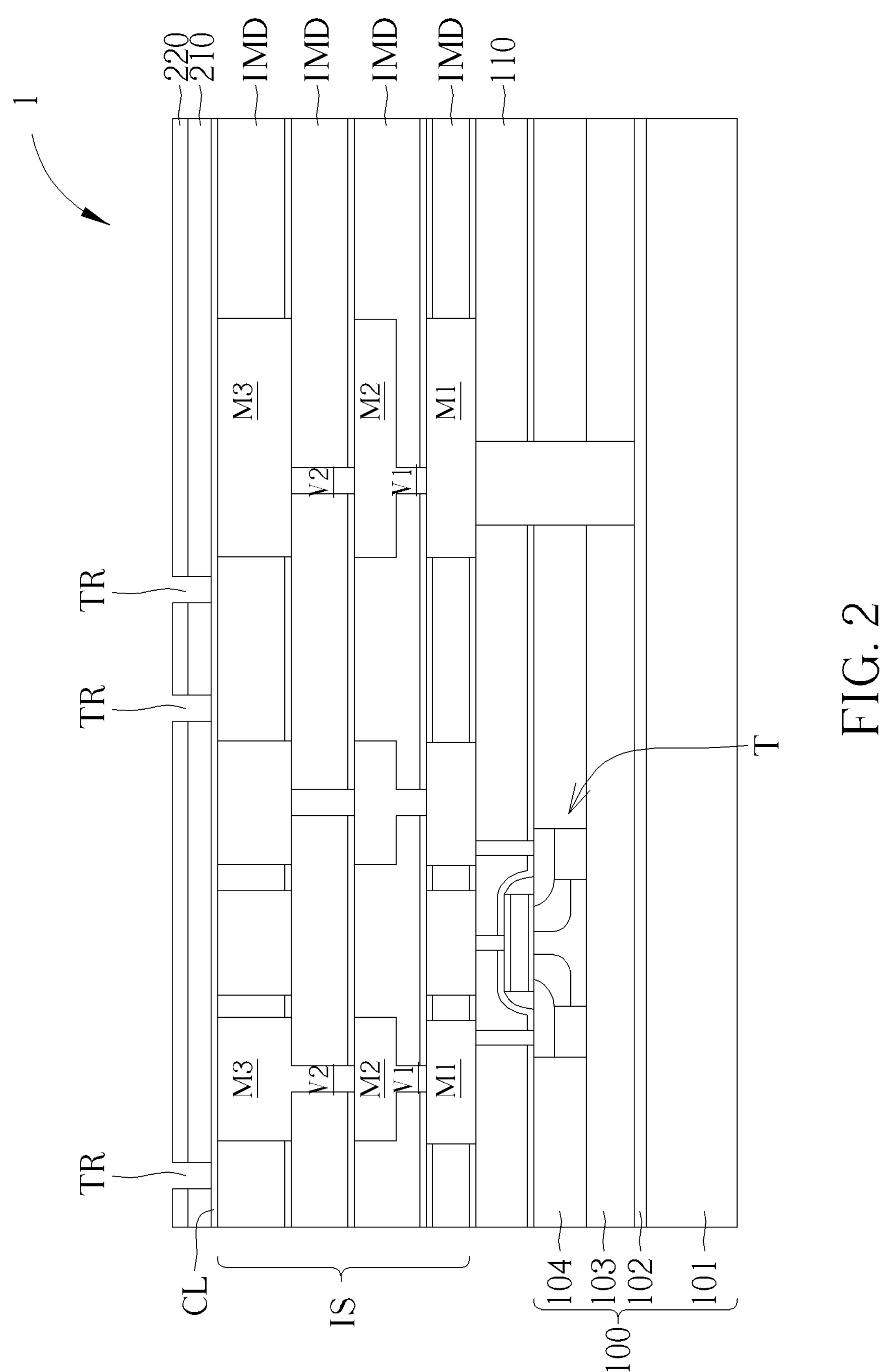

As shown in FIG. 2, a photolithography process and an etching process are then performed to form a trench TR in the bonding dielectric layer 220 and the top dielectric layer 210. According to an embodiment of the present invention, the trench TR does not overlap the underlying metal conductor layer M3. According to some embodiments of the present invention, the trench TR may overlap the underlying metal conductor layer M3. According to an embodiment of the present invention, the trench TR does not penetrate through the cap layer CL.

Figure 3:
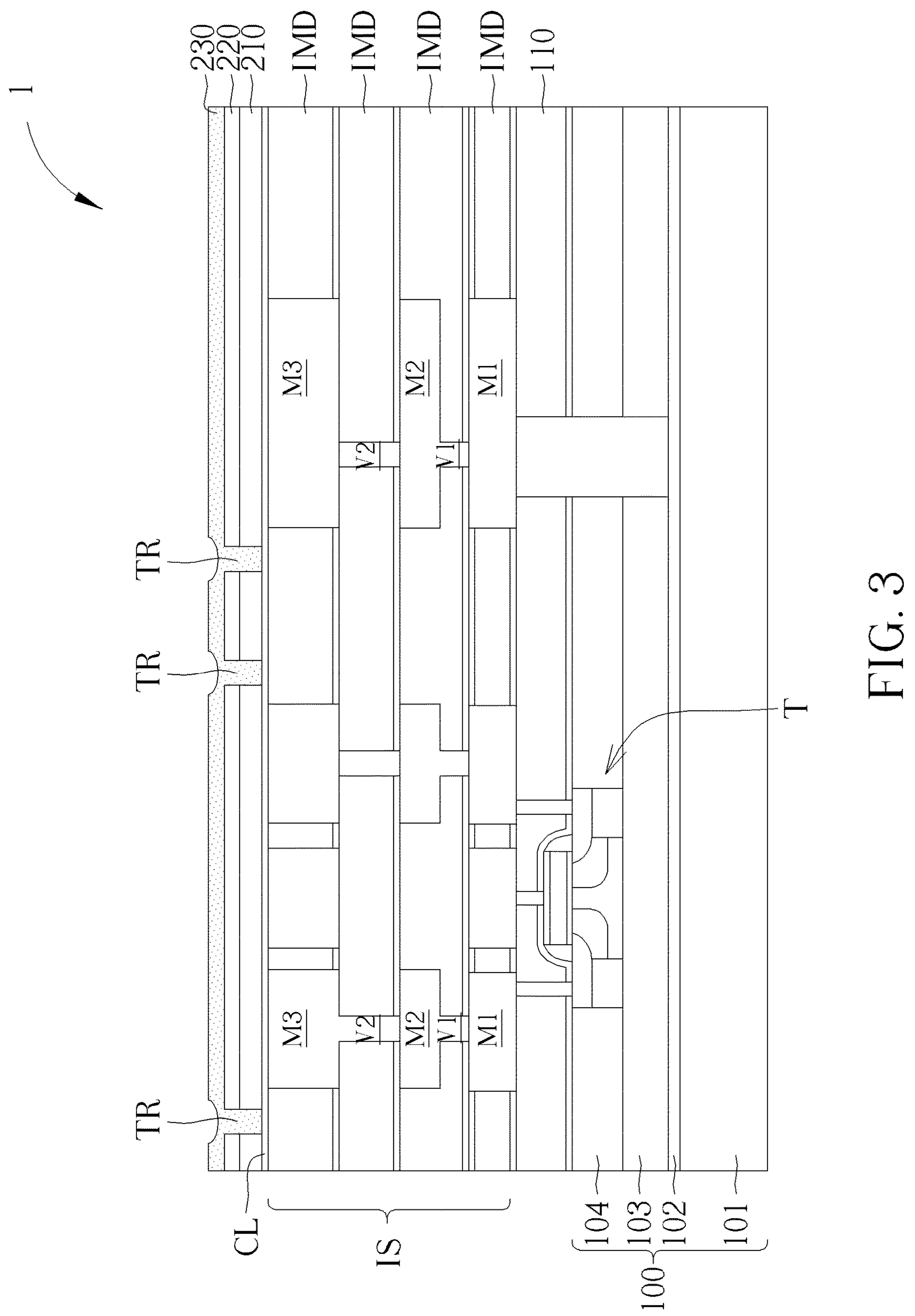

As shown in FIG. 3, a chemical vapor deposition (CVD) process is then performed to deposit a silicon-rich oxide layer 230, such as a SiOCH layer, on the semiconductor substrate 100 in a blanket manner. According to an embodiment of the present invention, for example, the atomic percentage of silicon in the silicon-rich oxide layer 230 is greater than or equal to 30%. At this point, the trench TR may be completely filled with the silicon-rich oxide layer 230.

Figure 4:
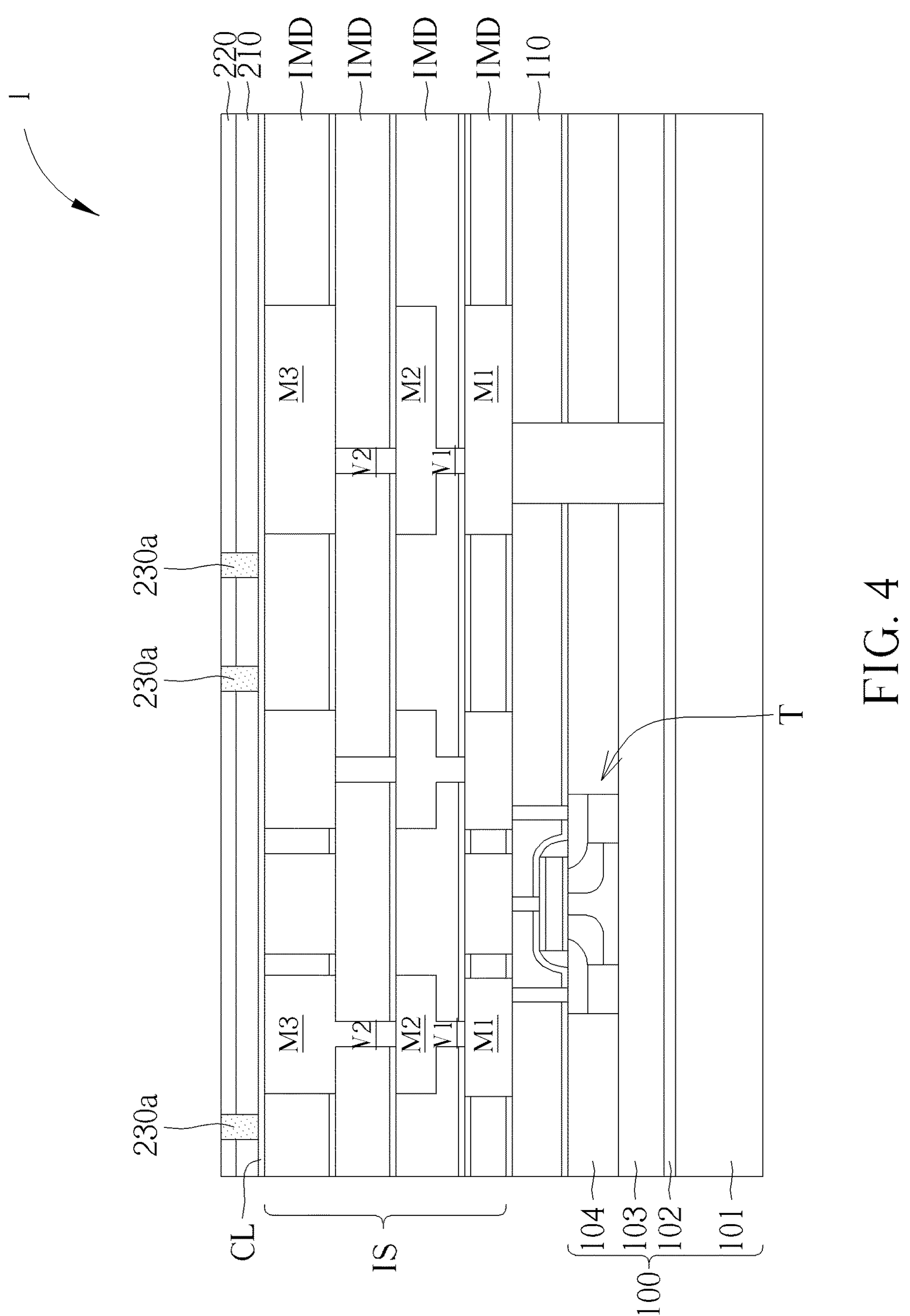

As shown in FIG. 4, a chemical mechanical polish (CMP) process is then performed to form a plurality of dangling-bond pads 230*a* in the bonding dielectric layer 220 and the top dielectric layer 210. According to an embodiment of the present invention, the top surfaces of the plurality of dangling-bond pads 230*a* are coplanar with the top surface of the bonding dielectric layer 220. According to an embodiment of the present invention, a large number of dangling bonds is formed on the top surface of the dangling-bond pad 230*a*

Figure 5:
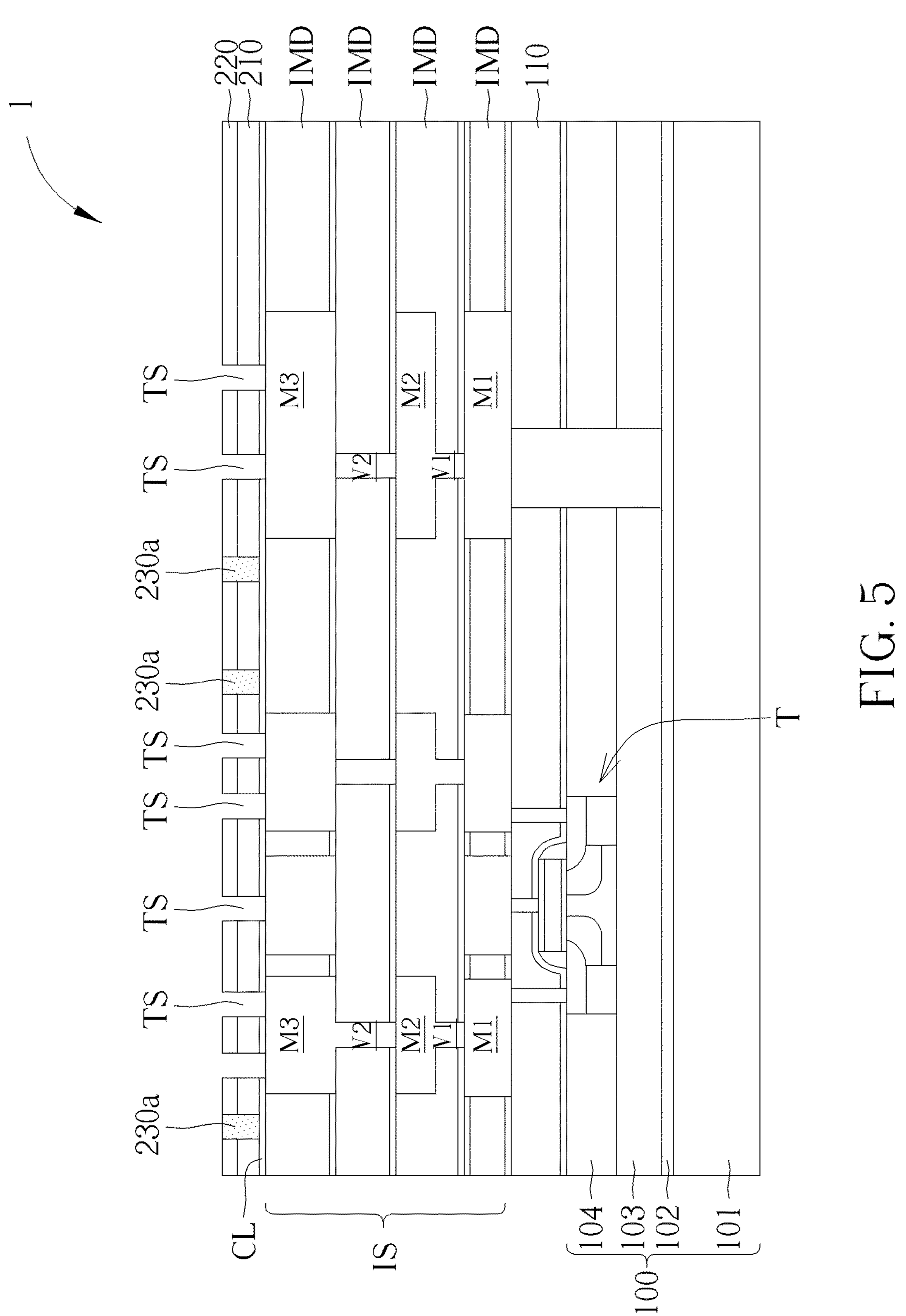

As shown in FIG. 5, a photolithography process and an etching process are then performed to form a trench TS in the bonding dielectric layer 220 and the top dielectric layer 210. According to an embodiment of the present invention, the trench TS overlaps the underlying metal conductor layer M3. According to an embodiment of the present invention, the trench TS penetrates the cap layer CL.

Figure 6:
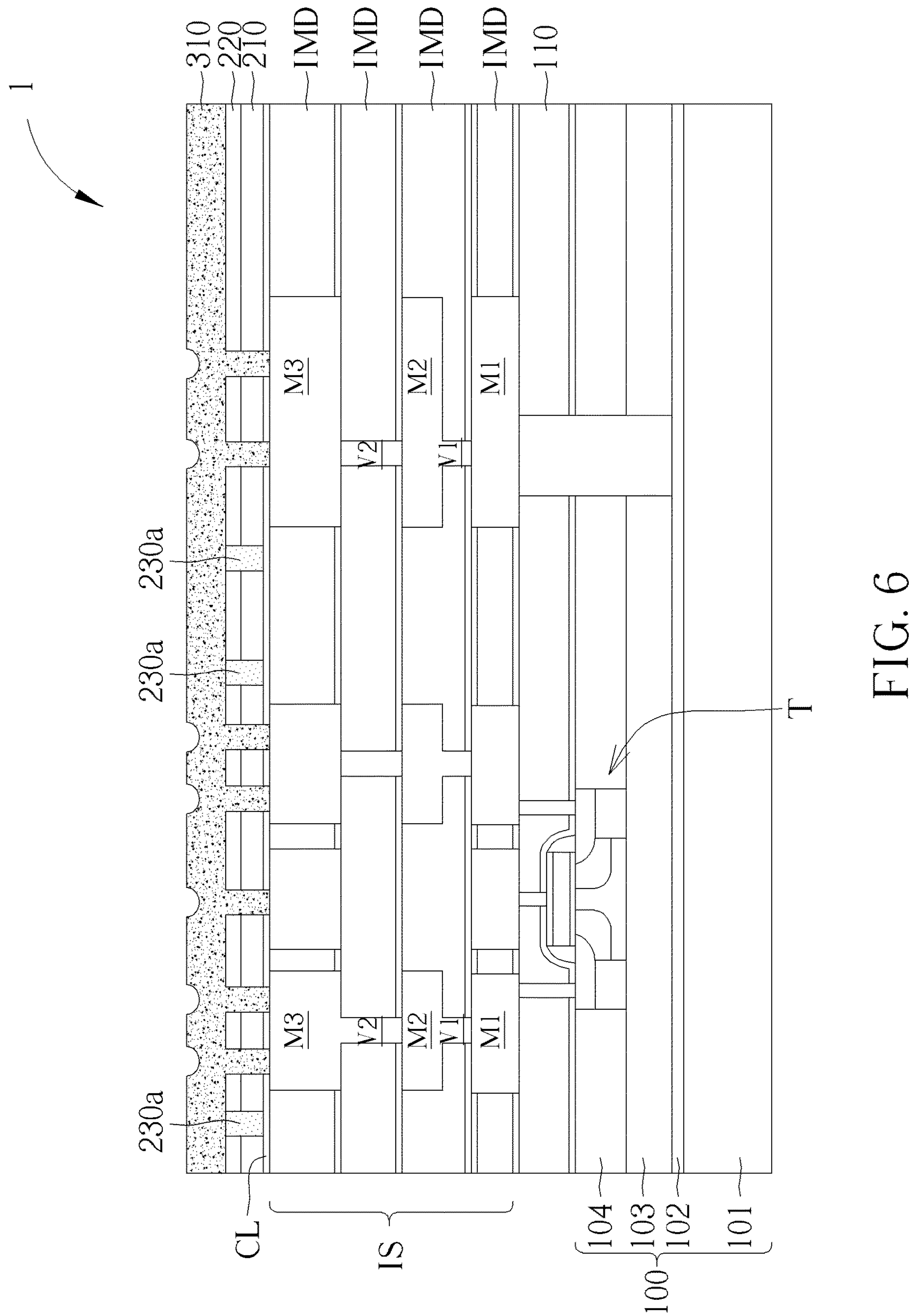

As shown in FIG. 6, a deposition process or an electroplating process is then performed to deposit a conductive layer 310, such as a copper metal layer, on the semiconductor substrate 100 in a blanket manner. At this point, the trench TS may be completely filled with the conductive layer 310.

Figure 7:
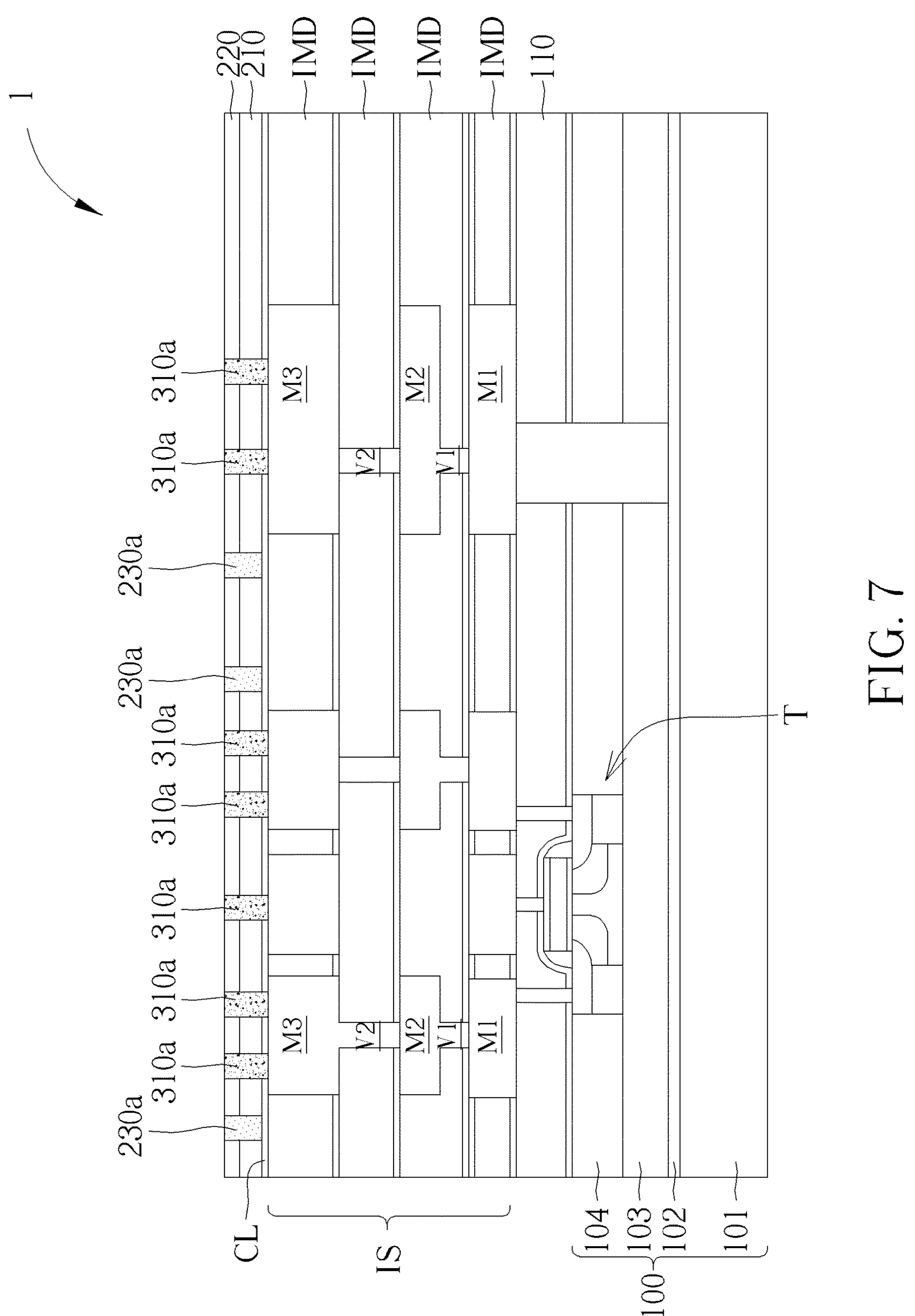

As shown in FIG. 7, a chemical mechanical polishing process is then performed to planarize the conductive layer 310, thereby forming a plurality of copper pads 310*a* in the bonding dielectric layer 220, the top dielectric layer 210 and the cap layer CL. According to an embodiment of the present invention, the plurality of copper pads 310*a* is used to form bonds with corresponding copper pads on another wafer (not shown), and the plurality of dangling-bond pads 230*a* can enhance the wafer bonding strength.

Structurally, as shown in FIG. 7, the semiconductor structure 1 of the present invention includes: a semiconductor substrate 100; an interconnection structure IS provided on the semiconductor substrate 100; a cap layer CL provided on the interconnection structure IS; a top dielectric layer 210 disposed on the cap layer CL; a bonding dielectric layer 220 disposed on the top dielectric layer 210; a plurality of copper pads 310*a* disposed in the bonding dielectric layer 220, the top dielectric layer 210 and the cap layer CL; and a plurality of dangling-bond pads 230*a* provided in the bonding dielectric layer 220 and the top dielectric layer 210.

According to an embodiment of the present invention, the plurality of dangling-bond pads 230*a* may include a silicon-rich oxide layer. According to an embodiment of the present invention, the plurality of dangling-bond pads 230*a* may include a SiOCH layer. According to an embodiment of the present invention, the plurality of dangling-bond pads 230*a* does not penetrate through the cap layer CL.

According to an embodiment of the present invention, a top surface of the plurality of dangling-bond pads 230*a* is coplanar with a top surface of the plurality of copper pads 310*a* and a top surface of the bonding dielectric layer 220.

According to an embodiment of the present invention, the top dielectric layer 210 may include silicon oxide. According to an embodiment of the present invention, the thickness of the top dielectric layer 210 is 9000-9500 angstroms.

According to an embodiment of the present invention, the bonding dielectric layer 220 may include nitrogen-doped silicon carbide. According to an embodiment of the present invention, the thickness of the bonding dielectric layer 220 is 1500-2100 angstroms.

According to an embodiment of the present invention, the semiconductor substrate 100 may include a silicon-on-insulator (SOI) substrate.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
- a semiconductor substrate;
- an interconnection structure disposed on the semiconductor substrate;
- a cap layer disposed on the interconnection structure;
- a top dielectric layer disposed on the cap layer;
- a bonding dielectric layer disposed on the top dielectric layer;

a plurality of copper pads disposed in the bonding dielectric layer, the top dielectric layer and the cap layer; and a plurality of dangling-bond pads disposed in the bonding dielectric layer and the top dielectric layer.

2. The semiconductor structure according to claim 1, wherein the plurality of dangling-bond pads comprises a silicon-rich oxide layer.

3. The semiconductor structure according to claim 1, wherein the plurality of dangling-bond pads comprises a SiOCH layer.

4. The semiconductor structure according to claim 1, wherein the plurality of dangling-bond pads does not penetrate through the cap layer.

5. The semiconductor structure according to claim 1, wherein the plurality of dangling-bond pads has a top surface that is coplanar with a top surface of the plurality of copper pads and a top surface of the bonding dielectric layer.

6. The semiconductor structure according to claim 1, wherein the top dielectric layer comprises silicon oxide.

7. The semiconductor structure according to claim 1, wherein the top dielectric layer has a thickness of 9000-9500 angstroms.

8. The semiconductor structure according to claim 1, wherein the bonding dielectric layer comprises nitrogen-doped silicon carbide.

9. The semiconductor structure according to claim 1, wherein the bonding dielectric layer has a thickness of 1500-2100 angstroms.

10. The semiconductor structure according to claim 1, wherein the semiconductor substrate comprises a silicon-on-insulator (SOI) substrate.

11. A method of forming a semiconductor structure, comprising:

providing a semiconductor substrate;

forming an interconnection structure on the semiconductor substrate;

forming a cap layer on the interconnection structure;

forming a top dielectric layer on the cap layer;

forming a bonding dielectric layer on the top dielectric layer;

forming a plurality of copper pads in the bonding dielectric layer, the top dielectric layer and the cap layer; and forming a plurality of dangling-bond pads in the bonding dielectric layer and the top dielectric layer.

12. The method according to claim 11, wherein the plurality of dangling-bond pads comprises a silicon-rich oxide layer.

13. The method according to claim 11, wherein the plurality of dangling-bond pads comprises a SiOCH layer.

14. The method according to claim 11, wherein the plurality of dangling-bond pads does not penetrate through the cap layer.

15. The method according to claim 11, wherein the plurality of dangling-bond pads has a top surface that is coplanar with a top surface of the plurality of copper pads and a top surface of the bonding dielectric layer.

16. The method according to claim 11, wherein the top dielectric layer comprises silicon oxide.

17. The method according to claim 11, wherein the top dielectric layer has a thickness of 9000-9500 angstroms.

18. The method according to claim 11, wherein the bonding dielectric layer comprises nitrogen-doped silicon carbide.

19. The method according to claim 11, wherein the bonding dielectric layer has a thickness of 1500-2100 angstroms.

20. The method according to claim 11, wherein the semiconductor substrate comprises a silicon-on-insulator (SOI) substrate.

* * * * *